(12) United States Patent
Goda et al.

(10) Patent No.: US 10,504,596 B2
(45) Date of Patent: Dec. 10, 2019

(54) APPARATUSES AND METHODS OF FORMING APPARATUSES USING A PARTIAL DECK-BY-DECK PROCESS FLOW

(75) Inventors: Akira Goda, Boise, ID (US); Roger W. Lindsay, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 188 days.

(21) Appl. No.: 13/450,299

(22) Filed: Apr. 18, 2012

(65) Prior Publication Data

US 2013/0277731 A1    Oct. 24, 2013

(51) Int. Cl.

| | | |
|---|---|---|
| *H01L 27/11524* | (2017.01) | |
| *H01L 27/08* | (2006.01) | |
| *H01L 27/088* | (2006.01) | |
| *H01L 21/8239* | (2006.01) | |
| *H01L 21/822* | (2006.01) | |
| *H01L 21/02* | (2006.01) | |
| *H01L 21/311* | (2006.01) | |
| *G11C 16/04* | (2006.01) | |

(Continued)

(52) U.S. Cl.
CPC .... *G11C 16/0408* (2013.01); *H01L 27/11556* (2013.01); *H01L 27/11582* (2013.01)

(58) Field of Classification Search
CPC . H01L 27/115–11597; H01L 27/11551; H01L 27/11578; H01L 27/11524; H01L 27/11529; H01L 27/1157; H01L 27/0688; H01L 27/2481; H01L 29/4234–42352; H01L 29/66825–66833; H01L 29/792–7926; H01L 21/31055; H01L 21/31116; H01L 21/31138; H01L 21/28282; H01L 21/67069; H01L 21/822; H01L 25/0657; H01L 29/0642; H01L 29/0649; H01L 29/4991; H01L 21/76289; H01L 21/76283; H01L 21/764; H01L 21/8221
USPC ... 257/324, E21.09, 499, E21.645, E21.614, 257/E27.06, E27.046, E27.103; 438/212, 438/211, 620, 618, 637, 514, 689, 591, 438/478, 586, 261, 268
See application file for complete search history.

(56) References Cited

U.S. PATENT DOCUMENTS

| | | | | |
|---|---|---|---|---|
| 2002/0030211 A1* | 3/2002 | Keeth et al. | | 257/296 |
| 2004/0004863 A1* | 1/2004 | Wang | | H01L 27/115 365/199 |

(Continued)

*Primary Examiner* — Natalia A Gondarenko
(74) *Attorney, Agent, or Firm* — Schwegman Lundberg & Woessner, P.A.

(57) ABSTRACT

Various embodiments include methods and apparatuses, such as memory cells formed on two or more stacked decks. A method includes forming a first deck with first levels of conductor material and first levels of dielectric material over a substrate. Each level of the conductor material is separated from an adjacent level of conductor material by at least one of the first levels of dielectric material. A first opening is formed through the first levels of conductor material and dielectric material. A sacrificial material is formed at least partially filling the first opening. A second deck is formed over the first deck. The second deck has second levels of conductor material and second levels of dielectric material with each level of the conductor material being separated from an adjacent level of conductor material by at least one of the second levels of dielectric material. Additional apparatuses and methods are disclosed.

17 Claims, 13 Drawing Sheets

(51) Int. Cl.
*H01L 27/11556* (2017.01)
*H01L 27/11582* (2017.01)

(56) References Cited

U.S. PATENT DOCUMENTS

| | | | |
|---|---|---|---|
| 2009/0108333 A1* | 4/2009 | Kito et al. | 257/324 |
| 2009/0230449 A1* | 9/2009 | Sakaguchi et al. | 257/298 |
| 2009/0242966 A1* | 10/2009 | Son et al. | 257/324 |
| 2010/0034028 A1* | 2/2010 | Katsumata et al. | 365/185.28 |
| 2010/0109072 A1* | 5/2010 | Kidoh et al. | 257/324 |
| 2010/0176440 A1* | 7/2010 | Omura | 257/324 |
| 2010/0184275 A1* | 7/2010 | Takeuchi et al. | 438/482 |
| 2010/0240205 A1* | 9/2010 | Son et al. | 438/588 |
| 2010/0327339 A1* | 12/2010 | Tanaka | H01L 27/11573 257/324 |
| 2011/0151667 A1* | 6/2011 | Hwang et al. | 438/667 |
| 2011/0233646 A1* | 9/2011 | Mizushima et al. | 257/324 |
| 2011/0287612 A1* | 11/2011 | Lee | H01L 27/11565 438/478 |
| 2011/0309430 A1* | 12/2011 | Purayath et al. | 257/321 |
| 2012/0052674 A1* | 3/2012 | Lee | H01L 27/11578 438/591 |

\* cited by examiner

APPARATUSES AND METHODS OF FORMING APPARATUSES USING A PARTIAL DECK-BY-DECK PROCESS FLOW

BACKGROUND

Computers and other electronic products, for example, digital televisions, digital cameras, and cellular phones, often use one or more memory devices to store information. Memory devices include memory cells. As the demand for increased storage capacity in memory devices increases, there is a need to increase the density of the memory cells to retain a correspondingly small device size.

DETAILED DESCRIPTION

A deck-by-deck process flow has an advantage of a lower etching aspect ratio. However, in the prior art, devices formed in a lower deck are subject to effects from thermal processes during upper deck processing. The additional thermal effects can cause thicker materials to be formed at the lower deck, potentially leading to a degradation in cell reliability and integrity, problems with channel mobility, salicide instability, and increased power usage.

The embodiments disclosed herein may provide deck-by-deck formation and shared processing on, for example, one or all of the cell tunnel oxidations, channel poly-silicon depositions, or word line salicidation operations. The disclosed formation operations may thus realize a lower etching aspect ratio coupled with a reduced or eliminated impact on lower decks due to thermal processing of upper or subsequently formed decks.

One disclosed method of fabrication, and the resulting apparatuses, has an architecture comprising stacked three-dimensional structures with multiple decks. The structures may be used to form, for example, strings of memory cells.

Figure 1:
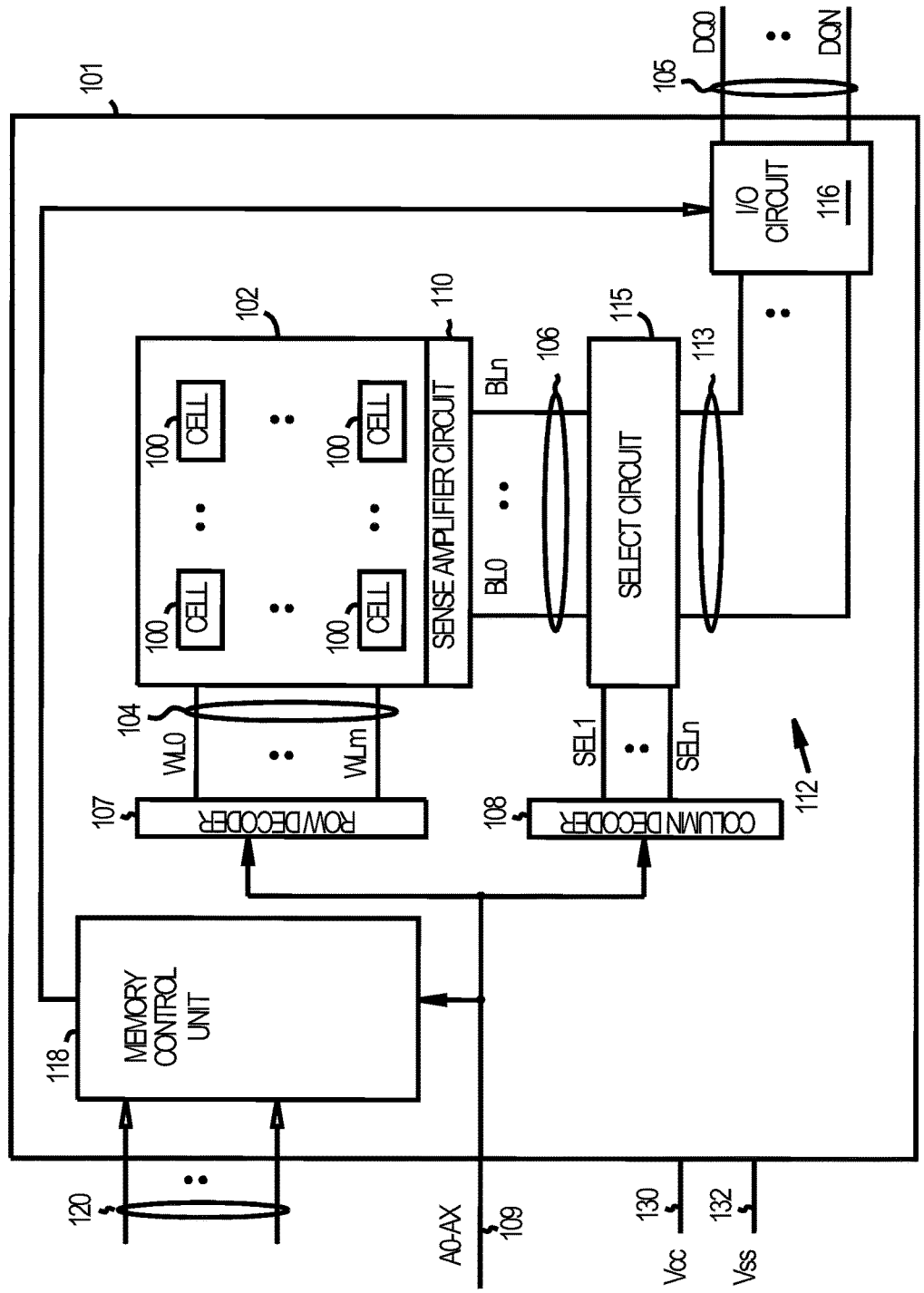
FIG. 1 shows a block diagram of a memory device having a memory array with memory cells, according to an embodiment.

Referring now to FIG. 1, a block diagram of an apparatus in the form of a memory device 101 is shown. The memory device 101 is shown to include a memory array 102 having a number (e.g., one or more) of memory cells 100 according to an embodiment. The memory cells 100 can be arranged in rows and columns along with access lines 104 (e.g., wordlines to conduct signals WL0 through WLm) and first data lines 106 (e.g., bit lines to conduct signals BL0 through BLn). The memory device 101 can use the access lines 104 and the first data lines 106 to transfer information to and from the memory cells 100. A row decoder 107 and a column decoder 108 decode address signals A0 through AX on address lines 109 to determine which ones of the memory cells 100 are to be accessed.

A sense amplifier circuit 110 operates to determine the value of information read from the memory cells 100 and transmits the information in the form of signals to the first data lines 106. The sense amplifier circuit 110 can also use the signals on the first data lines 106 to determine values of information to be written to the memory cells 100.

The memory device 101 is further shown to include circuitry 112 to transfer information between the memory array 102 and input/output (I/O) lines 105. Signals DQ0 through DQN on the I/O lines 105 can represent information read from or to be written into the memory cells 100. The I/O lines 105 can include nodes within the memory device 101 (or alternatively, pins, solder balls, or other interconnect technologies such as controlled collapse chip connections (C4), or flip chip attach (FCA)) on a package where the memory device 101 can reside. Other devices external to the memory device 101 (e.g., a memory controller or a processor, not shown in FIG. 1) can communicate with the memory device 101 through the I/O lines 105, the address lines 109, or the control lines 120.

The memory device 101 can perform memory operations, such as a read operation, to read information from selected ones of the memory cells 100; and a programming operation (also referred to as a write operation) to program (e.g., to write) information into selected ones of the memory cells 100. The memory device 101 can also perform a memory erase operation to clear information from some or all of the memory cells 100. A memory control unit 118 controls memory operations based on signals present on the control lines 120. Examples of the signals presented on the control lines 120 can include one or more clock signals and other signals to indicate which operation (e.g., a programming or read operation) the memory device 101 can or should perform. Other devices external to the memory device 101 (e.g., a processor or a memory controller) can control the values of the control signals on the control lines 120. Specific combinations of values of the signals on the control lines 120 can produce a command (e.g., a programming or read command) that can cause the memory device 101 to perform a corresponding memory operation (e.g., a program, read, or erase operation).

Each of the memory cells 100 can be programmed to a different one of at least two data states to represent, for example, a value of a single bit or a value of multiple bits such as two, three, four, or a higher number of bits. For example, each of the memory cells 100 can be programmed to one of two data states to represent a binary value of "0" or "1" of a single bit. Such a cell is sometimes called a single level cell. In another example, each of the memory cells 100 can be programmed to one of more than two data states to represent a value of, for example, multiple bits, such as one of four possible values "00," "01," "10," and "11" of two bits, one of eight possible values "000," "001," "010," "011," "100," "101," "110," and "111" of three bits, or one of another set of values of multiple bits. A cell that can be programmed to more than two data states is sometimes referred to as a multi-level cell (or multi-state cell). Various operations on these types of cells are discussed in more detail, below.

The memory device 101 can receive a supply voltage, including supply voltage signals $V_{cc}$ and $V_{ss}$, on a first supply line 130 and a second supply line 132, respectively. Supply voltage signal $V_{ss}$ can, for example, be at a ground potential (e.g., having a value of approximately zero volts). Supply voltage signal $V_{ss}$ can also operate at other voltages. Supply voltage signal $V_{cc}$ can include an external voltage supplied to the memory device 101 from an external power source such as a battery or an alternating-current to direct-current (AC-DC) converter circuitry (not shown in FIG. 1).

The circuitry 112 of the memory device 101 is further shown to include a select circuit 115 and an I/O circuit 116. The select circuit 115 can respond to signals SEL1 through SELn to select signals on the first data lines 106 and the second data lines 113 to represent the information read from or to be programmed into the memory cells 100. The column decoder 108 can selectively activate the SEL1 through SELn signals based on the A0 through AX address signals on the address lines 109. The select circuit 115 can select the signals on the first data lines 106 and the second data lines 113 to provide communication between the memory array 102 and the I/O circuit 116 during read and programming operations.

The memory device 101 can include a non-volatile memory device and the memory cells 100 can include non-volatile memory cells, such that the memory cells 100 can retain information stored therein when power (e.g., $V_{cc}$, $V_{ss}$, or both) is disconnected from the memory device 101.

Each of the memory cells 100 can include a memory element having material, at least a portion of which can be programmed to a desired data state (e.g., by storing a corresponding amount of charge on a charge storage structure, such as a floating gate or charge trap, coupled with threshold voltage, $V_t$, changes after program or erase operations). Different data states can thus represent different values of information programmed in each of the memory cells 100.

The memory device 101 can perform a programming operation when it receives (e.g., from an external processor or a memory controller) a programming command and a value of information to be programmed into one or more selected ones of the memory cells 100. Based on the value of the information, the memory device 101 can program the selected memory cells to appropriate data states to represent the values of the information to be stored therein.

One of ordinary skill in the art may recognize that the memory device 101 may include other components, at least some of which are discussed herein. However, several of these components are not necessarily shown in the figure, so as not to obscure the various embodiments described. The memory device 101 may include devices and memory cells, and operate using memory operations (e.g., programming and erase operations) similar to or identical to those described below with reference to various other figures and embodiments discussed herein.

Figure 2A:
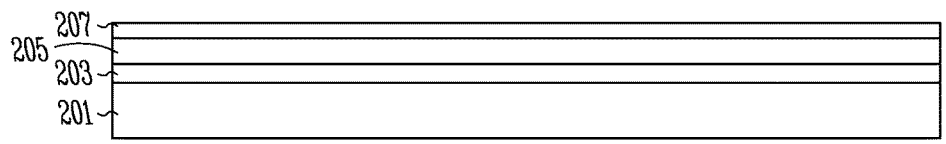
FIGS. 2A through 2T show various portions of a fabrication process to form memory cells using a partial deck-by-deck process flow, according to an embodiment.
Figure 2B:
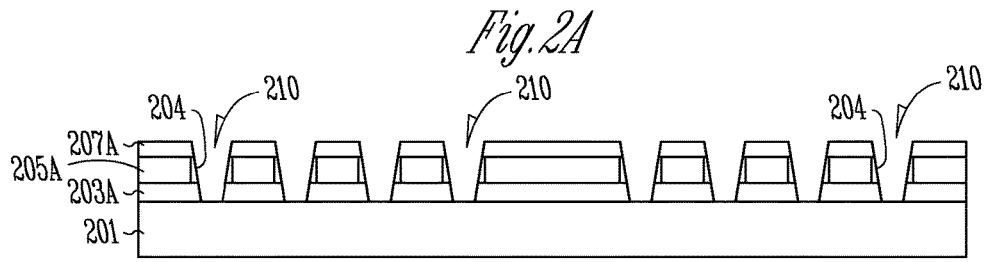
Figure 2C:
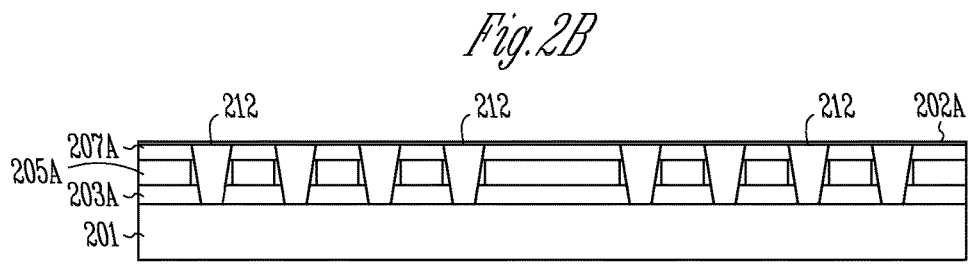
Figure 2D:
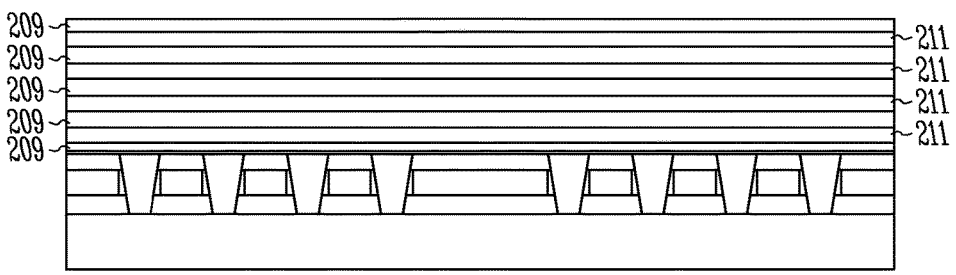
Figure 2E:
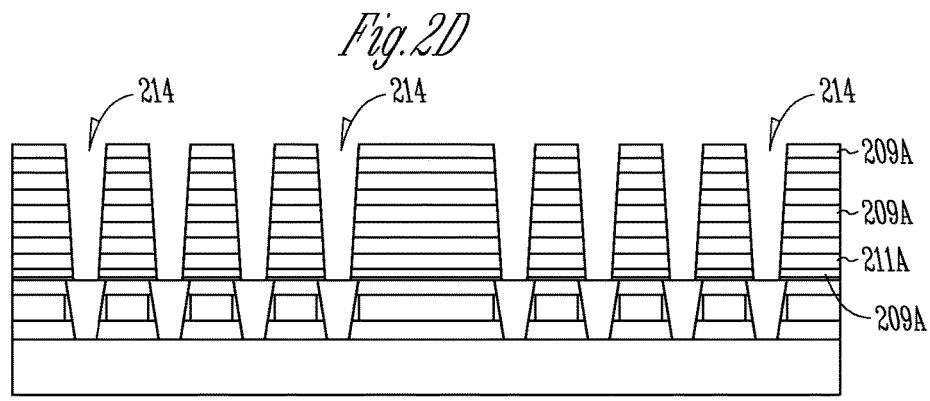
Figure 2F:
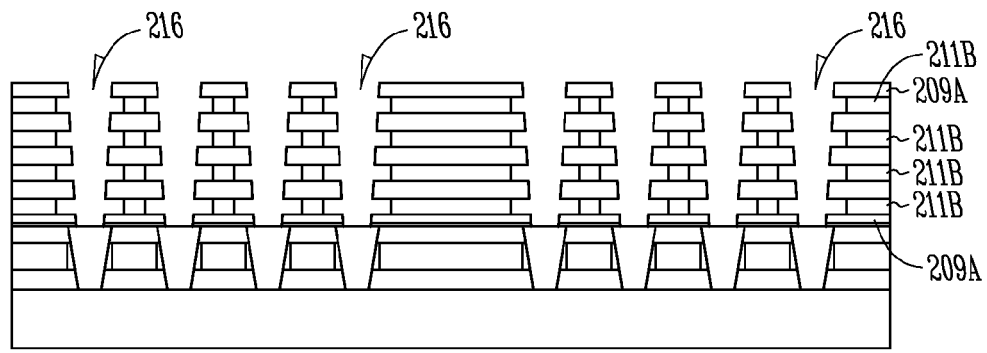
Figure 2G:
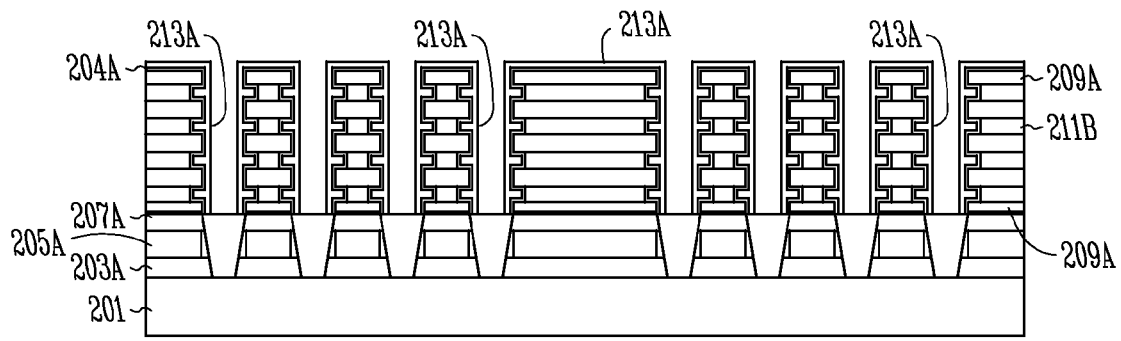
Figure 2H:
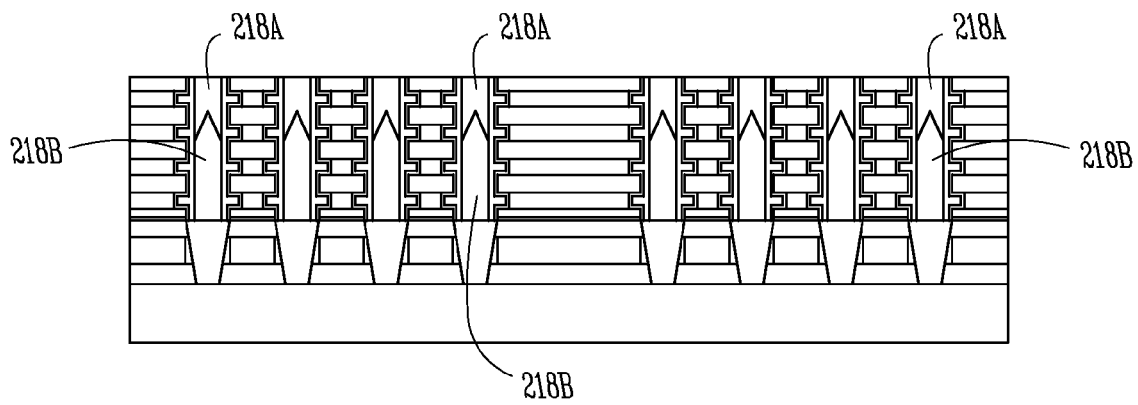
Figure 2I:
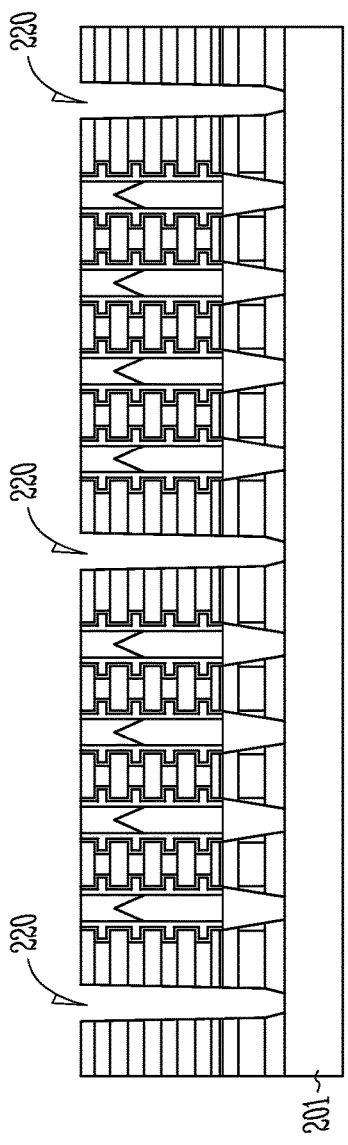
Figure 2J:
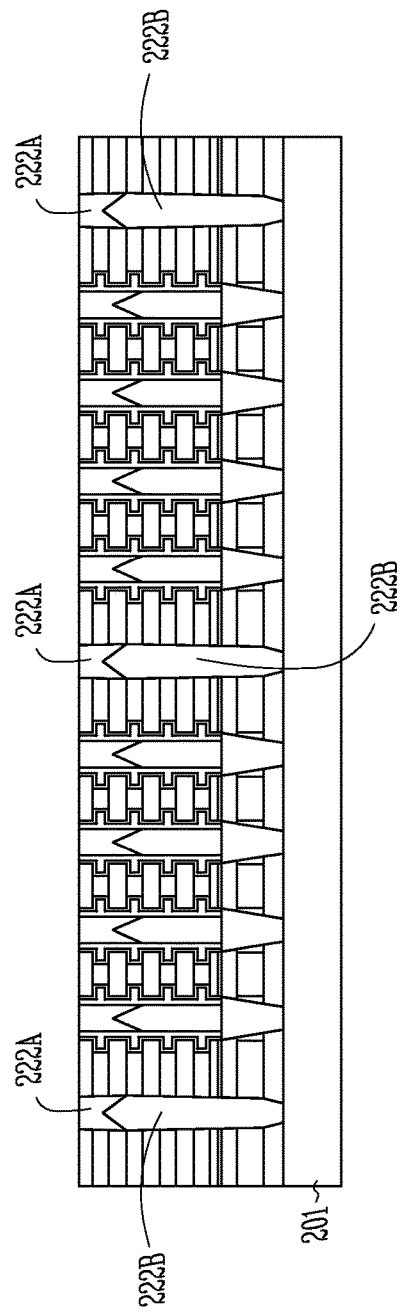
Figure 2K:
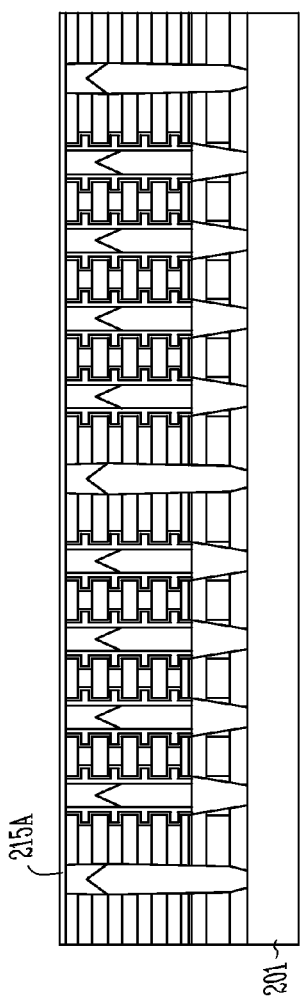
Figure 2L:
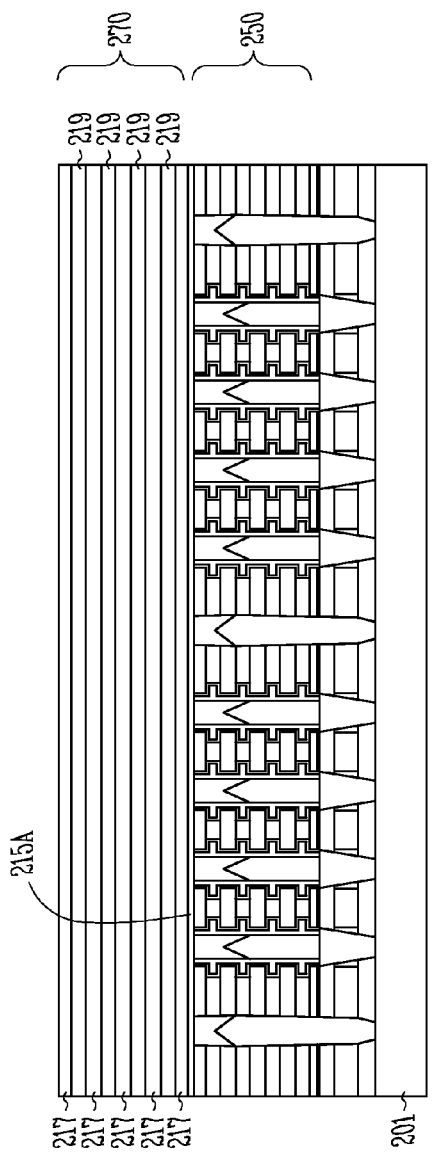
Figure 2M:
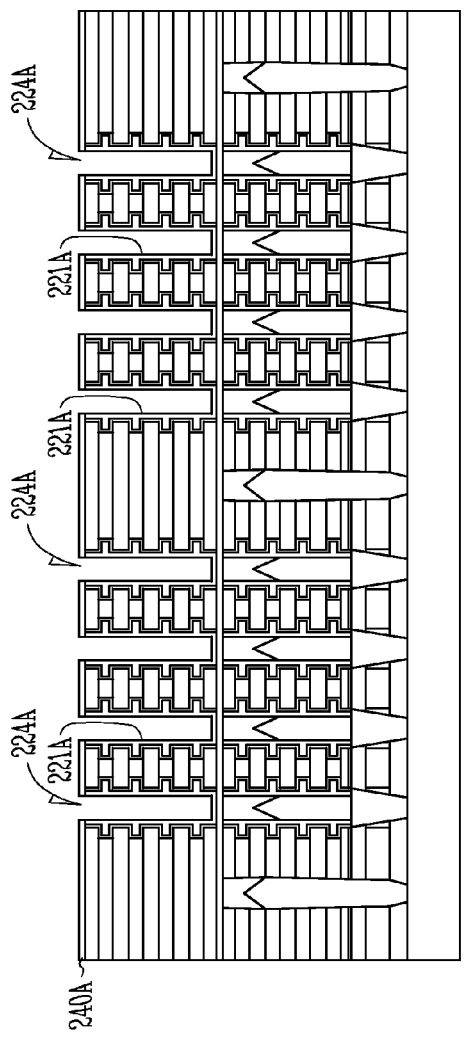
Figure 2N:
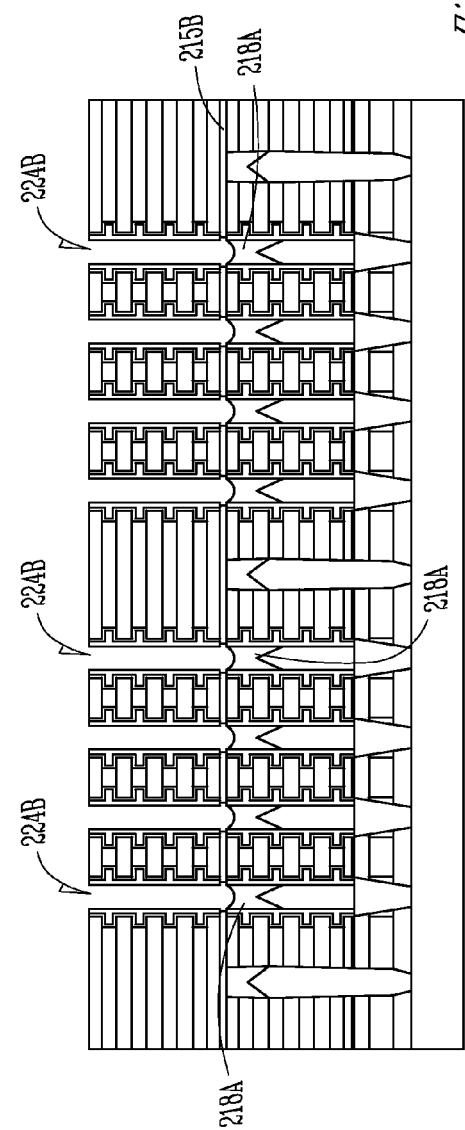
Figure 20:
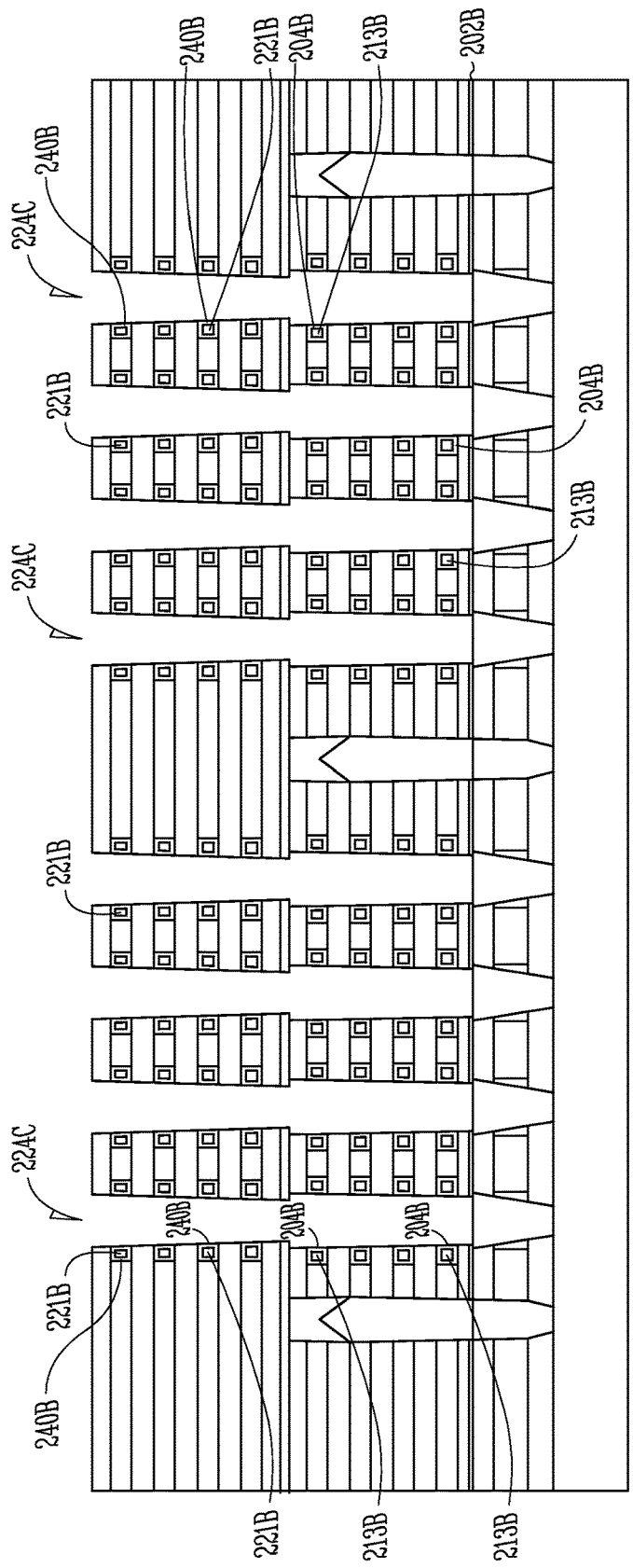
Figure 2P:
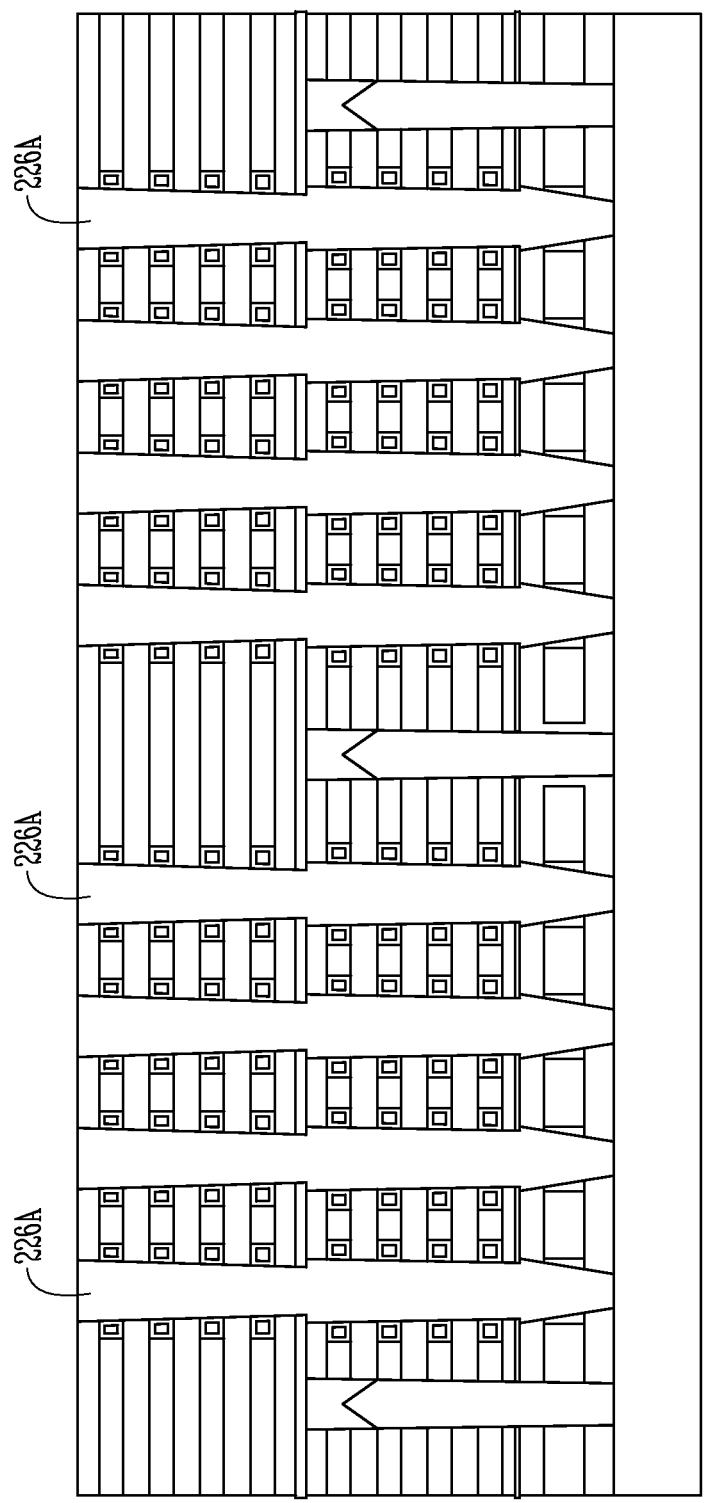
Figure 29:
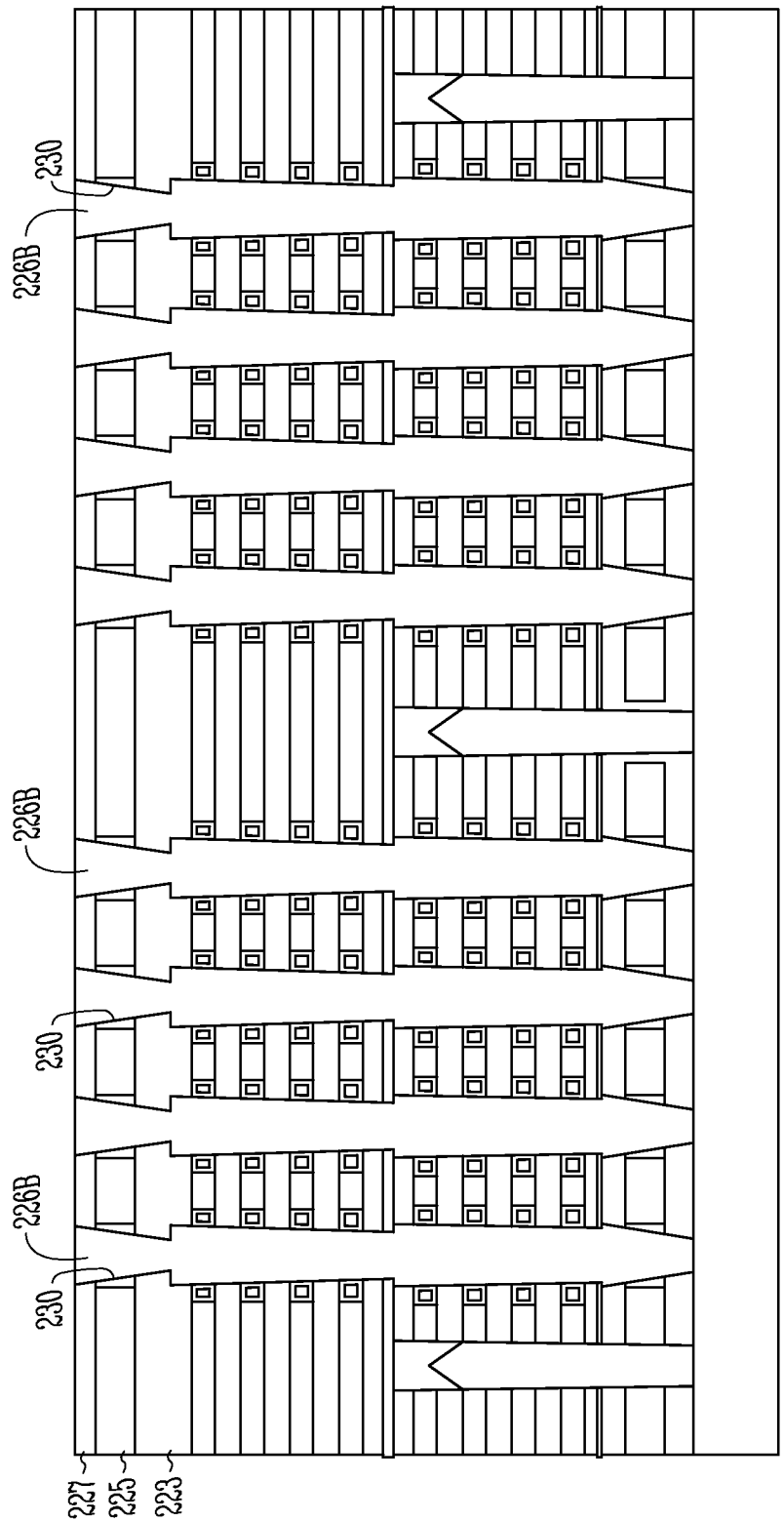
Figure 2R:
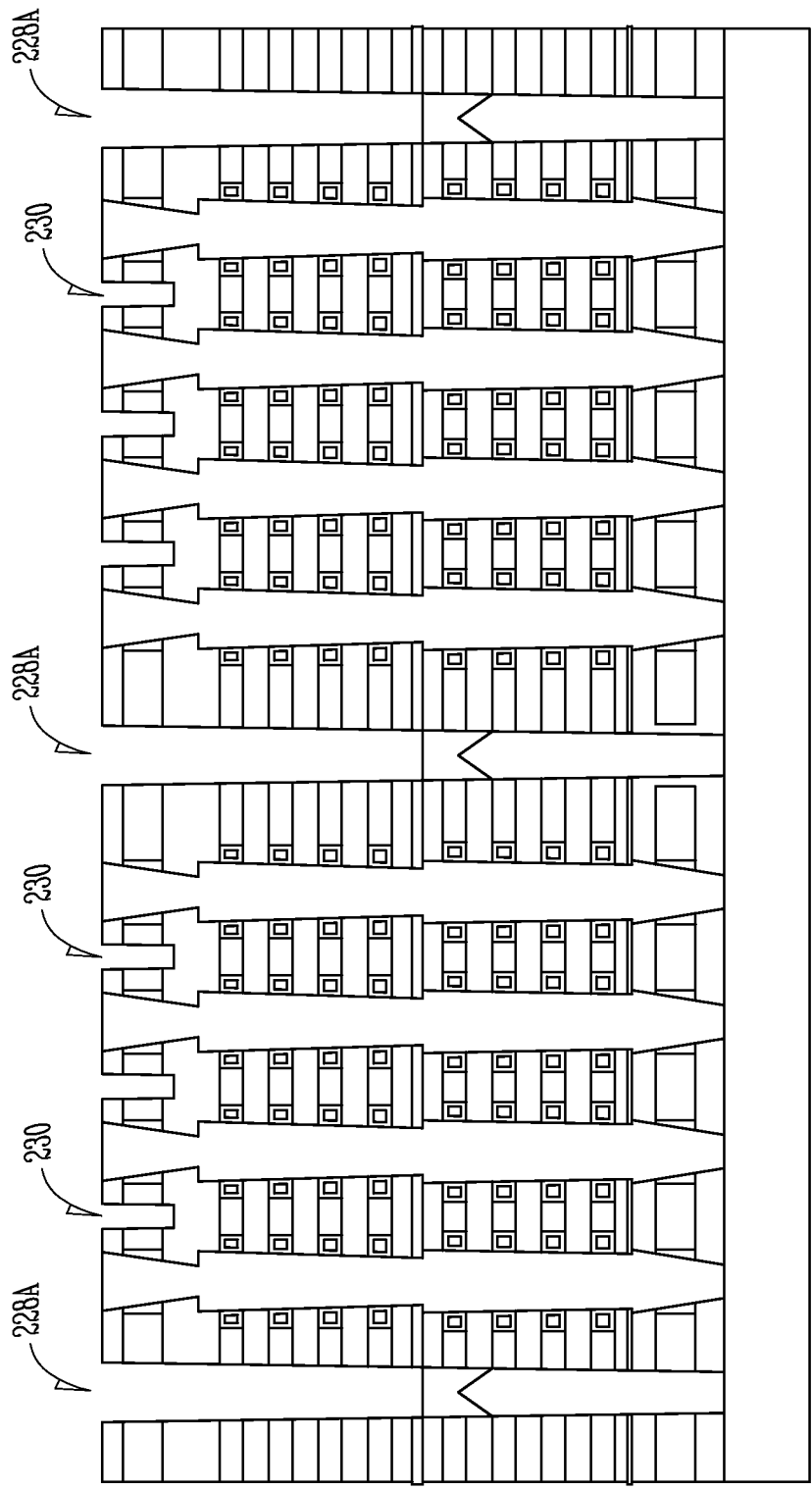
Figure 2S:
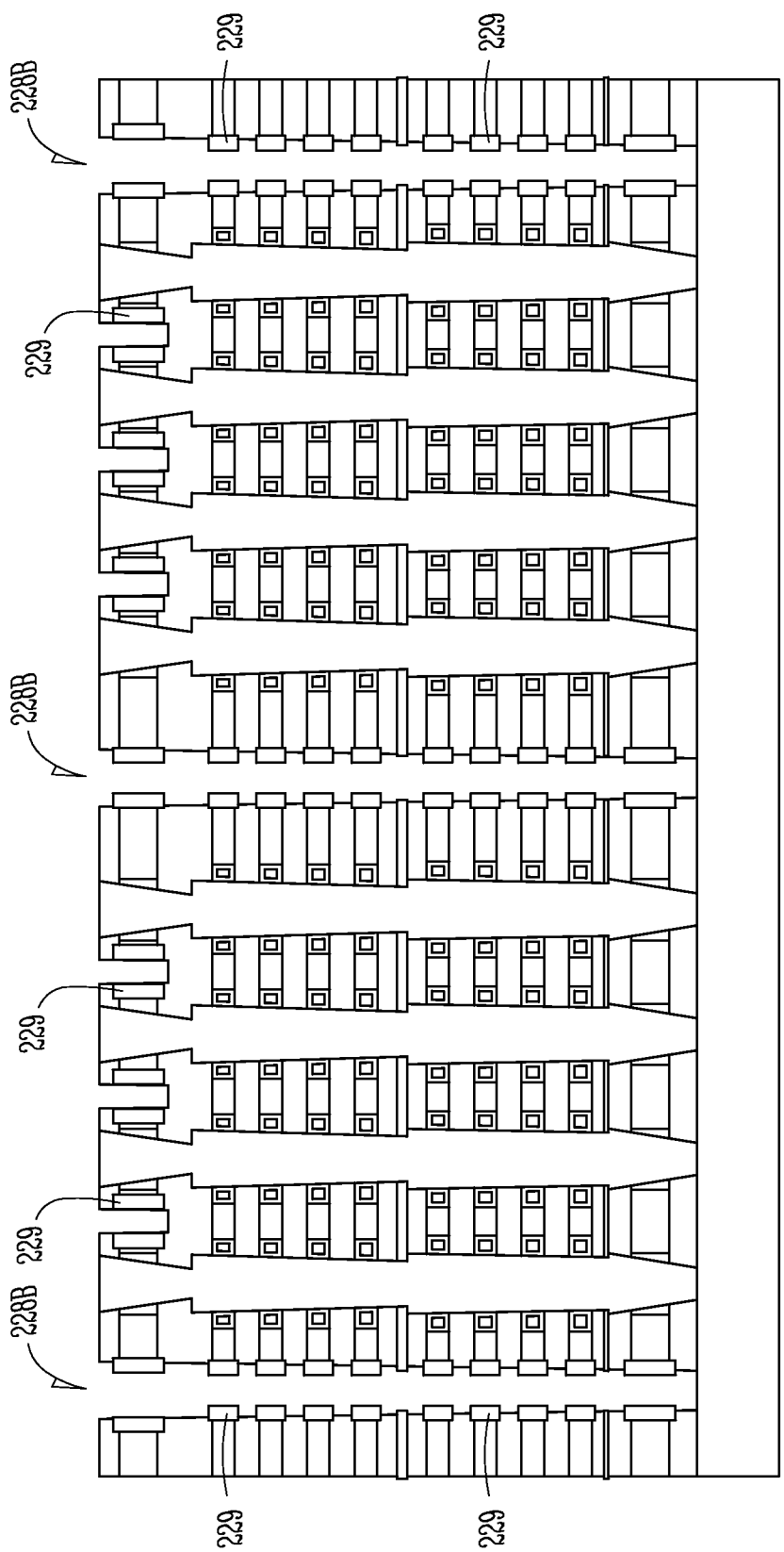
Figure 2T:
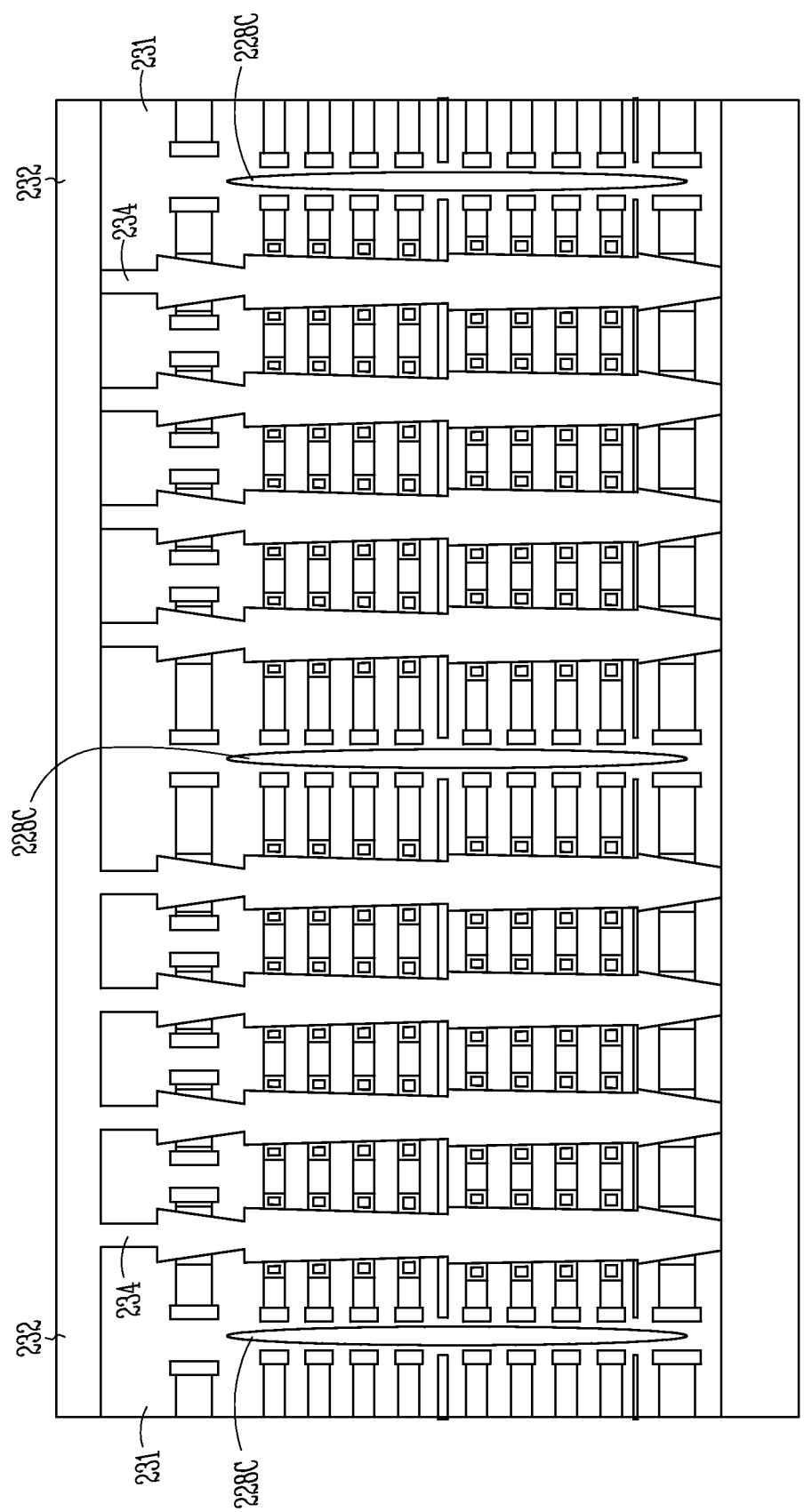

FIGS. 2A through 2T show various portions of a fabrication process to form memory cells using a partial deck-by-deck process flow, according to an embodiment. As discussed above, the techniques and fabrication processes described herein can be extended to a number of different apparatuses (e.g., in addition to memory devices) to be fabricated using various processes, including, for example, a three-dimensional process. However, fabrication of a NAND memory device will be described below to retain clarity and consistency in the discussions that follow.

In FIG. 2A, initial formation of a source side select gate (SGS) structure is shown. The initial formation includes a source material 201 having levels of various materials formed thereover including a first dielectric material 203 (e.g., silicon dioxide, $SiO_2$), a conductor material 205 (e.g., conductively doped poly-silicon), and a second dielectric material 207 (e.g., $SiO_2$). Each of these and other materials described herein may be applied, deposited, or otherwise formed according to techniques and methods known independently in the art. The techniques and methods can include one or more deposition activities, such as chemical vapor deposition (CVD), atomic level deposition (ALD), physical vapor deposition (PVD), or other techniques known independently in the art. Forming multiple materials in various levels may be accomplished via stacked deposition operations.

Although the process acts and operations described herein may refer to particular conductor, semiconductor or dielectric materials, such as silicon, silicon dioxide, silicon nitride, or others, a person of ordinary skill in the art and familiar with this disclosure will recognize that other conductor, semiconductor and dielectric materials may be substituted and still be within a scope of the disclosed subject matter. Thus, the material choices and selections presented are merely provided as an aid in understanding one example of a fabrication process.

For example, various types of semiconductor materials, such as various elemental and compound semiconductors, may be used as an alternative for or in conjunction with silicon. Additionally, various types of dielectric materials, such as tantalum pentoxide ($Ta_2O_5$), silicon nitride ($Si_xN_y$), aluminum oxide ($Al_2O_3$), hafnium oxide ($HfO_2$), and a variety of other dielectric materials can be used as an alternative to or in conjunction with silicon dioxide or silicon nitride.

The source material 201 can include, for example, a conductively doped poly-silicon material or a conductively doped region of a semiconductor substrate. As referred to herein, a semiconductor substrate can be any of various types of substrates used in the semiconductor and allied industries, such as silicon wafers, compound wafers, thin film head assemblies, polyethylene-terephthalate (PET) films deposited or otherwise formed with a semiconducting material, as well as numerous other types of substrates known independently in the art, and/or portions thereof. Also, in some embodiments, the source material 201 may be formed over a non-semiconductor material, or vice-versa.

For ease of understanding the fabrication acts and operations that follow, the source material 201 may be considered to be, for example, a layer of N+ doped poly-silicon or an N+ doped region of a P-type substrate. Upon reading and understanding the disclosure provided herein, a person of ordinary skill in the art will understand how to modify the fabrication activities to account for the use of other types of materials in fabricating a variety of electronic devices.

The first dielectric material 203 and the second dielectric material 207 may be of the same or different materials. Also, the first dielectric material 203 and the second dielectric material 207 may be formed from the same material but by different methods. For example, the first dielectric material 203 may be a thermally-grown silicon dioxide material and the second dielectric material 207 may be a deposited silicon dioxide material (or vice versa). As a person of ordinary skill in the art understands, there are certain optical, electrical, and other differences between these two types of formed silicon dioxides. Thus, the material choices and selections presented are merely provided as an aid in understanding one example of a fabrication process.

In FIG. 2B, formation of the SGS structure continues with SGS pillar hole etching. Holes are etched or otherwise at least partially opened to form a number of openings 210. The openings 210 are formed and produce an etched first dielectric material 203A, an etched conductor material 205A, and an etched second dielectric material 207A. A gate dielectric 204 is formed adjacent the etched conductor material 205A. Formation of the gate dielectric 204 is performed by methods known independently in the art. The material for the gate dielectric 204 may comprise any of the dielectric materials discussed herein.

In a specific embodiment, the openings 210 can be formed by an anisotropic dry etch process (e.g., reactive ion etch (RIE) or plasma etch). In other embodiments, depending upon materials selected, the openings 210 may be formed by one or more various types of chemical anisotropic etchants (e.g., such as potassium hydroxide (KOH) or tetramethyl ammonium hydroxide (TMAH)), mechanical techniques, other types of ion milling, or laser ablation techniques. Related industries such as those involved in constructing micro-electrical mechanical systems (MEMS) devices may independently supply techniques for still further means to form the openings 210.

In FIG. 2C, the openings 210 are filled with a channel-fill material 212 (e.g., poly-silicon or other semiconductor material). The channel-fill material 212 is then planarized (e.g., using a chemical-mechanical planarization (CMP) technique) so that the upper surface of the channel-fill material 212 is substantially coplanar with the upper surface of the etched second dielectric material 207A. A barrier material 202A is then formed over the channel-fill material 212 and the etched second dielectric material 207A. The barrier material 202A may comprise, for example, titanium nitride (TiN), tantalum nitride (TaN), titanium oxide (TiO$_2$), tantalum oxide (Ta$_2$O$_5$), silicon dioxide (SiO$_2$), silicon nitride (Si$_3$N$_4$), tetraethylorthosilicate (TEOS), or a number of other materials to function as a barrier layer between adjacent materials.

With reference now to FIG. 2D, a number of alternating materials can be formed over the barrier material 202A. Forming the alternating materials begins an embodiment of a fabrication process to form vertical memory cells. The number of alternating materials can be selected, depending upon the application and device type desired.

The alternating materials comprise a number of dielectric materials 209 and a number of conductor materials 211. Each of the levels of the dielectric material 209 is separated from a respective adjacent one of the levels of the dielectric material 209 by at least a respective one of the levels of the conductor material 211.

Each of the dielectric materials 209 may comprise silicon dioxide or a number of other dielectric materials. The conductor materials 211 may comprise conductively doped poly-silicon or a number of other conductor materials. Although each of the dielectric materials 209 and the conductor materials 211 may be construed as being comprised of the same material on each level, respectively, various levels may comprise different materials. For example, a first level of the dielectric material 209 may comprise silicon dioxide while a later-formed second level of the dielectric material 209 may comprise tantalum pentoxide. Similarly, a first level of the conductor material 211 may comprise conductively doped poly-silicon while a later-formed second level of the conductor material 211 may comprise conductively doped germanium or a compound semiconductor material.

In FIG. 2E, pillar hole etching is performed in preparation for channel formation, described in subsequent steps. Holes are etched or otherwise at least partially opened to form a number of channel openings 214. The channel openings 214 are formed and produce etched versions of the alternating materials including an etched dielectric material 209A and an etched-conductor material 211A. In some embodiments, the channel openings 214 may be formed through the barrier material 202A to the channel-fill material 212. In other embodiments, the channel openings 214 may be formed down to or partially through the barrier material 202A. If the channel-fill material 212 is not exposed at this point in the process flow, the barrier material 202A over the channel-fill material 212 may be later removed and the channel material exposed in subsequent steps (e.g., as discussed with reference to FIG. 2O, below).

In FIG. 2F, each of the etched-conductor materials 211A are recessed by etching or otherwise have portions removed laterally (forming a recess away from the sidewall of the channel openings 214). The lateral removal of material forms a number of conductor materials 211B and a number of enlarged channel-openings 216.

Referring now to FIG. 2G, a charge blocking dielectric (CBD) material 204A is formed over exposed portions of the barrier material 202A, the etched dielectric materials 209A, and the conductor materials 211B. Accordingly, the CBD material 204A is formed adjacent laterally recessed portions of the conductor materials 211B. A charge-storage material 213A is then formed adjacent the CBD material 204A.

As is understood by a person of ordinary skill in the art, the CBD material 204A may be formed from a number of dielectric materials discussed herein. In various embodiments, the CBD material 204A can be a high dielectric constant (high-κ) material. Generally, a high dielectric constant material may be considered as any material having a dielectric constant equal or greater than the dielectric constant of silicon dioxide. The dielectric constant for silicon dioxide is approximately 3.9. In various embodiments, the CBD material 204A may be formed as a film comprising a single layer material. For example, the single layer material may comprise silicon dioxide (SiO$_2$), tantalum pentoxide (Ta$_2$O$_5$), silicon nitride (Si$_3$N$_4$), aluminum oxide (Al$_2$O$_3$), hafnium oxide (HfO$_2$), or a variety of other dielectric materials. Also, a multilayer film may be used to form the CBD material 204A. The multi-layer film may be formed as, for example, an arrangement of silicon dioxide films and a silicon nitride film (e.g., an oxide-nitride-oxide (ONO) film, which is a high-dielectric constant material). In other examples, combinations of single layer and multilayer films can be made.

The charge-storage material 213A may comprise one or more of the semiconductor materials discussed herein. In various embodiments, the charge-storage material 213A comprises poly-silicon. In various embodiments, the charge storage material 213A comprises silicon nitride (e.g., Si$_3$N$_4$).

In FIG. 2H, upper surfaces of the CBD material 204A and the charge-storage material 213A are at least partially etched or otherwise removed. As indicated in FIG. 2H, remaining portions of the CBD material 204A and the charge-storage material 213A are primarily or entirely formed on opposing faces of the enlarged channel-openings 216. That is, the CBD material 204A and the charge-storage material 213A are substantially or entirely removed from the top level of the etched dielectric materials 209A and the uppermost portion of the channel-fill material 212 (FIG. 2C).

With continuing reference to FIG. 2H, a sacrificial material 218A is then formed to at least partially cap an airspace 218B formed within the enlarged channel-openings 216. In other embodiments, the sacrificial material 218A may completely fill the enlarged channel-openings 216. After formation of the sacrificial material 218A, a CMP process may be used to planarize the upper surface.

The sacrificial material 218A may comprise various types of materials. However, since the sacrificial material 218A is removed in later processing steps, the sacrificial material 218A may be formed from a material that is dissimilar from the charge-storage material 213A so as to facilitate selective etching. For example, the sacrificial material 218A may comprise a deposited silicon dioxide that can be chemically removed with a buffered-oxide etchant (BOE), such as such as a combination of ammonium fluoride (NH$_4$F) and hydrofluoric acid (HF) that readily etches materials such as silicon dioxide, but has little affect on materials such as polysilicon. In other embodiments, the sacrificial material 218A may comprise the same material as the charge-storage material 213A, and is removed using an isotropic etchant, such as a directional RIE or plasma etch. In still other embodiments, the sacrificial material 218A may be another dielectric such as borophosphosilicate glass (BPSG) supplied from a tetraethoxysilane (TEOS) source. In still other embodiments, the sacrificial material 218A may be a solvent-based liquid that is applied to substrates using a spin-coat process, such as photoresist. The use and application of these various materials will be understood by a person of ordinary skill in the art upon reading and understanding the disclosure provided herein.

In FIG. 2I, a number of gate-slit openings 220 are formed. The gate-slit openings 220 are formed to isolate the conductor materials 211B (FIG. 2G). As discussed in more detail, below, the gate-slit openings 220 can be left as an air gap or filled with various types of dielectric material, such as, for example, silicon dioxide.

In FIG. 2J, a second sacrificial material 222A is formed to at least partially cap an airspace 222B formed within the gate-slit openings 220 in an embodiment. In other embodiments, the second sacrificial material 222A may completely fill the gate-slit openings 220. In still other embodiments, the gate-slit openings 220 may be formed prior to the sacrificial material 218A of FIG. 2H being formed. In this case, both the sacrificial material 218A and the second sacrificial material 222A may be formed substantially concurrently with formation of the sacrificial material 218A. The sacrificial material 218A and the second sacrificial material 222A may comprise the same, similar or different materials, as discussed above. After formation of the sacrificial material 218A, a CMP process may be used to planarize the upper surface of the structure.

With reference now to FIG. 2K, a barrier material 215A is formed over the sacrificial material 218A, the second sacrificial material 222A, and a top level of the etched dielectric material 209A. The barrier material 215A comprises a physical layer designed to prevent intermixing of the layers above and below the barrier material 215A and may provide for chemical inertness with respect to adjacent materials.

In various embodiments, the barrier material 215A comprises titanium nitride (TiN), tantalum nitride (TaN), titanium oxide ($TiO_2$), tantalum oxide ($Ta_2O_5$), silicon dioxide ($SiO_2$), silicon nitride ($Si_3N_4$), tetraethylorthosilicate (TEOS), or a number of other materials to function as a barrier layer between adjacent materials.

In FIG. 2L, the formation of a second deck 270 of memory cells begins over a first deck 250. The first deck 250 is discussed with reference to FIGS. 2D through 2K. The second deck 270 is at least partially formed by forming a number of alternating materials over the first deck 250. As discussed with reference to FIG. 2D above, the alternating materials may comprise a number of dielectric materials 217 and a number of conductor materials 219. The exact number of alternating materials can be varied depending upon the application and device type desired. Each of the levels of the dielectric material 217 is separated from a respective adjacent one of the levels of the dielectric material 217 by at least a respective one of the levels of the conductor material 219.

As discussed above, each of the dielectric materials 217 may comprise silicon dioxide or a number of other dielectric materials. The conductor materials 219 may comprise conductively doped poly-silicon or a number of other conductively doped semiconductor materials, for example. Although each of the dielectric materials 217 and the conductor materials 219 may be construed as being comprised of the same material on each level, respectively, various levels may comprise different materials.

In FIG. 2M, pillar holes are formed in preparation for channel formation, described in subsequent operations. Holes may be etched or otherwise at least partially opened to form a number of channel openings 224A. The number of channel openings 224A formed through the second deck 270 are substantially vertically aligned with corresponding ones of the number of channel openings 214 (FIG. 2E) in the first deck 250. The channel openings may be opened to the barrier material 215A.

With continuing reference to FIG. 2M, each of the conductor materials 219 are recessed or otherwise have portions removed laterally (away from the sidewall of the channel openings 224A). A CBD material 240A is formed over exposed portions of the dielectric material 217, the conductor material 219, and the barrier material 215A (if it has been exposed by the process forming the channel opening 224A). As discussed above, the CBD material 240A may be formed from a number of dielectric materials discussed herein. In various embodiments, the CBD material 240A comprises ONO.

A charge-storage material 221A is then formed adjacent the CBD material 240A. The charge-storage material 221A may comprise one or more of the semiconductor materials discussed herein. In various embodiments, the charge-storage material 221A comprises poly-silicon.

In FIG. 2N, upper surfaces of the CBD material 240A and the charge-storage material 221A are at least partially etched or otherwise removed (e.g., by CMP or other chemical or mechanical means). In some embodiments, the barrier material 215A is punch-etched or otherwise removed below the channel openings 224A to form an enlarged channel-opening 224B. The enlarged channel-openings 224B are opened to the sacrificial material 218A (formed in FIG. 2H). As indicated in FIG. 2N, remaining portions of the CBD material 240A and the charge-storage material 221A can be primarily or entirely formed on opposing faces (sidewalls) of the enlarged channel-openings 224B.

With reference now to FIG. 2O, the sacrificial material 218A is etched or otherwise removed with, for example, a chemical etchant, ion milling, RIE, or plasma etching. Various isotropic chemical etchants were discussed above with reference to FIG. 2H. For example, if the sacrificial material 218A comprises silicon dioxide, a buffered-oxide etchant (BOE), such as a combination of ammonium fluoride ($NH_4F$) and hydrofluoric acid (HF) may be used to remove the sacrificial material 218A, with little effect on either of the now-exposed charge-storage materials 213A, 221A.

Once the sacrificial material 218A has been removed, a multi-deck channel opening 224C is cleared to either the barrier material 202A or the channel-fill material 212 (FIG. 2C) of the SGS structure depending upon whether the barrier material 202A was previously removed as discussed with reference to FIG. 2E. In either case, the multi-deck channel opening 224C may be cleared to the channel-fill material 212 by a punch-etch through the barrier material 202A if the barrier material 202A was not previously removed.

With continuing reference to FIG. 2O, in various embodiments, once the multi-deck channel opening 224C has been formed, the charge-storage materials 213A, 221A (FIG. 2N) may be etched or otherwise formed to be substantially co-planar with sidewalls of the multi-deck channel opening 224C. In other embodiments, the charge-storage materials 213A, 221A may be left to protrude from the sidewalls of the multi-deck channel opening 224C. However, depending upon the type of device being formed, in either case the charge-storage materials 213A, 221A may be either etched or otherwise formed to produce a number of individual (that is, not contacting one another) charge-storage structures 213B in the first deck 250 and charge-storage structures 221B in the second deck 270. Each of the charge-storage structures 213B and the charge-storage structures 221B may be similar or identical to one another. The difference in nomenclature is simply provided as an aid in describing the processes that follow.

A tunneling material 204B, 240B is substantially concurrently formed adjacent the charge-storage structures 213B (in the deck 250) and the charge-storage structures 221B (in the deck 270), respectively. By forming the tunneling material 204B, 240B substantially concurrently (as opposed to the prior art where such tunneling materials are formed separately, one deck at a time), problems discussed above with reference to the prior art van be avoided or reduced. Such problems include, for example, tunnel oxide reliability degradation for the lower deck due to the high temperature processing for the upper (or any subsequent) deck, that may occur during upper deck tunnel oxidation or an inter-poly-silicon dielectric formation for the upper deck. Also, in the prior art, tunnel oxide thickening of a lower deck can occur during upper deck formation due to the subsequent elevated temperature processing in the upper deck.

The tunneling material 204B, 240B may be formed from a number of dielectric materials discussed herein that allow for Fowler-Nordheim tunneling of electrons or direct tunneling of holes or other injection mechanisms. One such material is silicon dioxide. The tunneling material 204B, 240B is generally applied thinly (e.g., 2 nm to 8 nm thick, although other thicknesses may be used).

In an embodiment, the tunneling material 204B, 240B may be formed as a thermally-grown silicon dioxide layer. Although the thermally-grown oxide may also form over the channel-fill material 212, the oxide formed over the channel-fill material 212 may be removed with, for example, a RIE or various types of plasma etch while maintaining the presence of the tunneling material 204B, 240B formed adjacent the charge-storage structures 213B and the charge-storage structures 221B.

In prior art techniques, each deck of devices (e.g., cells) formed before other decks was subject to elevated temperatures used for subsequent deck processing. For example, if a prior art technique used thermally-grown silicon dioxide to form tunnel oxides, each already-formed deck would experience the same or similar elevated temperature used in forming the tunnel oxides in subsequent decks. Thus, tunnel oxides present in previously formed decks would continue to grow while tunnel oxides are formed in subsequent decks. Consequently, the previously formed decks will have a thicker tunnel oxide than the subsequent decks. As more decks are added, the tunnel oxide in each previous deck continues to increase in thickness. Thus, in devices formed in the various decks, more power may need to be applied to those devices in earlier formed decks in order for electrons to tunnel into their respective charge storage structures (e.g., a floating gates). If more power is not used, the electrons in the prior decks may not properly tunnel and device integrity in the previous decks may suffer.

In contrast to the prior art techniques, since the tunneling materials 204B, 240B are formed substantially concurrently, the method described herein forms a multi-deck electronic device having a substantially uniform tunnel oxide thickness for both the tunneling material 204B, formed adjacent the charge-storage structures 213B in the first deck 250, and the tunneling material 240B, formed adjacent the charge-storage structures 221B in the second deck 270. Consequently, power used for operating the electronic device that results should be substantially the same for each deck, coupled with a substantially similar device integrity for each deck.

Referring now to FIG. 2P, the multi-deck channel opening 224C (FIG. 2O) has a channel-fill material 226A formed therein. Since the channel-fill material 226A is formed in both the first deck 250 and the second deck 270 substantially concurrently, the channel-fill material 226A comprises a continuous channel. Further, since the channel is continuous, no oxidation of respective deck channels is formed—as occurs in the prior art.

Various channel-fill materials were discussed above with reference to FIG. 2C. Depending on whether any overfill of the channel-fill material 226A is present, a CMP operation may be used to provide substantial planarity of the channel-fill material 226A with the top level of the dielectric material 217.

In FIG. 2Q, initial formation of a drain side select gate (SDS) structure is shown on a side of the second deck that is distal to the first deck 250 as indicated by FIG. 2Q. The initial formation includes a first SDS dielectric material 223, an SDS conductor material 225, and a second SDS dielectric material 227. Each of the materials for the SDS formation may be similar or identical to the materials used to form the SGS structure described with reference to FIG. 2A, above. A gate dielectric 230 is formed adjacent the SDS conductor material 225. Formation of the gate dielectric 230 is performed by methods known independently in the art. The material for the gate dielectric 230 may comprise any of the dielectric materials discussed herein. Additionally, depending upon a thickness of the top level of the dielectric material 217, the first SDS dielectric material 223 may not be used.

An SDS channel-fill material 226B is then added over the channel-fill material 226A. As with the SDS structure, the SDS channel-fill material 226B may be formed from a similar or identical material as the channel-fill material 226A, such as poly-silicon. In various embodiments, the channel fill material 212 (FIG. 2C), the channel-fill material 226A, and the SDS channel-fill material 226B may all be doped differently from one another.

In FIG. 2R, a number of gate-slit openings 228A are formed. As discussed above with reference to the gate-slit openings 220, the gate-slit openings 228A are formed to isolate the conductor materials. The gate-slit openings 228A can be left as an air gap or filled with various types of dielectric material, such as, for example, silicon dioxide. The gate-slit openings 228A may be punch-etched through the barrier material 215A or etched down to the barrier material 215A.

With reference now to FIG. 2S, the second sacrificial material 222A is etched or otherwise removed with, for example, a chemical etchant, ion milling, RIE, or various types of plasma etch operations. Various isotropic chemical etchants were discussed above with reference to FIG. 2N.

Once the second sacrificial material 222A has been removed, a multi-deck gate-slit opening 228B is cleared to either the barrier material 202A or the channel-fill material 212 (FIG. 2C) of the SGS structure, depending upon whether the barrier material 202A was previously removed as discussed with reference to FIG. 2E. In either case, the multi-deck gate-slit opening 228B may be cleared to the channel-fill material 212 by a punch-etch through the barrier material 202A if the barrier material 202A was not previously removed.

A silicide (e.g., a salicide) material 229 is then formed on exposed areas of the conductor materials 221, 219 within the multi-deck gate-slit opening 228B. As is known independently in the art of semiconductor processing, a salicide is formed from a silicon or poly-silicon reaction with a metal, thus forming a new compound to form a silicide, in which the silicide is self-aligned with an underlying semiconductor structure. As with the single-step process of forming the tunneling materials 204B, 240B discussed with reference to FIG. 2O, the salicidation process can be completed in a single operation for multiple decks. Based on the methods presented herein, the salicides do not need to be formed on each deck separately as is found in the prior art. Accordingly, silicide can be substantially concurrently formed in each of the at least two decks of the apparatus.

In FIG. 2T, a capping material 231 is formed over the second SDS dielectric material 227, at least partially filling the multi-deck gate-slit opening 228B. If the capping material only partially fills the multi-deck gate-slit opening 228B, an airspace 228C is formed beneath the capping material 231. The capping material 231 may comprise any of the dielectric materials described herein.

The capping material 231 is etched or otherwise formed with openings to the SDS channel-fill material 226B (FIG. 2Q). A metallization operation is performed to form a data line 232 (e.g., a bitline) or other type of interconnect or electrode. The data line 232 may be formed from, for example, conductively doped polysilicon or some other conductor, such as copper or aluminum, using techniques such as those already known in the art.

Although discussed above with reference to a deck-by-deck process flow to form memory cell strings, such as NAND memory cell strings, this discussion format is used merely for clarity in the description. The fabrication techniques and architectures resulting from the process flow described herein can be extended to NOR devices, other memory types, microcontroller devices, general purpose logic, and a host of other apparatuses. Various three-dimensional devices, repeating devices (e.g., SRAM), transistors, standard CMOS logic, and so on may all benefit from application of the deck-by-deck process flow disclosed herein.

Further, in addition to the process flow, acts, and operations described above, other embodiments will be readily recognized by a person of ordinary skill in the art upon reading and understanding the description provided. For example, Table I through Table III, below, indicate other embodiments that may be integrated into or substituted for the acts and operations discussed above. Thus, Table I through Table III provide additional non-limiting embodiments to be considered.

TABLE I

Embodiment I

| Operation | Process Flow |
| --- | --- |
| Stack Deposition | Deck-by-Deck |
| Pillar Etch | Deck-by-Deck |
| Semiconductor Recess | Deck-by-Deck |
| CBD Formation | Deck-by-Deck |
| Charge-Storage Material Formation | Deck-by-Deck |
| Tunneling Material Formation | Multiple Decks Together |
| Channel Material Formation | Multiple Decks Together |
| Gate-Slit Formation | Deck-by-Deck |
| Silicide Formation | Multiple Decks Together |

TABLE II

Embodiment II

| Operation | Process Flow |
| --- | --- |
| Stack Deposition | Deck-by-Deck |
| Pillar Etch | Deck-by-Deck |
| Semiconductor Recess | Deck-by-Deck |
| CBD Formation | Deck-by-Deck |
| Charge-Storage Material Formation | Deck-by-Deck |
| Tunneling Material Formation | Deck-by-Deck |
| Channel Material Formation | Deck-by-Deck |
| Gate-Slit Formation | Deck-by-Deck |
| Silicide Formation | Multiple Decks Together |

TABLE III

Embodiment III

| Operation | Process Flow |
| --- | --- |
| Stack Deposition | Deck-by-Deck |
| Pillar Etch | Deck-by-Deck |
| Semiconductor Recess | Deck-by-Deck |
| CBD Formation | Deck-by-Deck |
| Charge-Storage Material Formation | Deck-by-Deck |
| Tunneling Material Formation | Deck-by-Deck |
| Channel Material Formation | Multiple Decks Together |
| Gate-Slit Formation | Deck-by-Deck |
| Silicide Formation | Multiple Decks Together |

The term "Multiple Decks Together" is used herein to mean that various acts and operations may be performed substantially concurrently (e.g., in the same step, substantially at the same time, or in close time-proximity to one another). Therefore, the term "Multiple Decks Together" is not intended to be limiting, but rather, simply indicates when an operation may be performed substantially concurrently in more than one deck. When the various acts and operations are performed substantially concurrently, various materials within a resultant device may be observed as being continuously formed (e.g., no observable boundaries when viewed under, for example, cross-sectional transmission electron microscopy (X-TEM) analysis).

Figure 3:
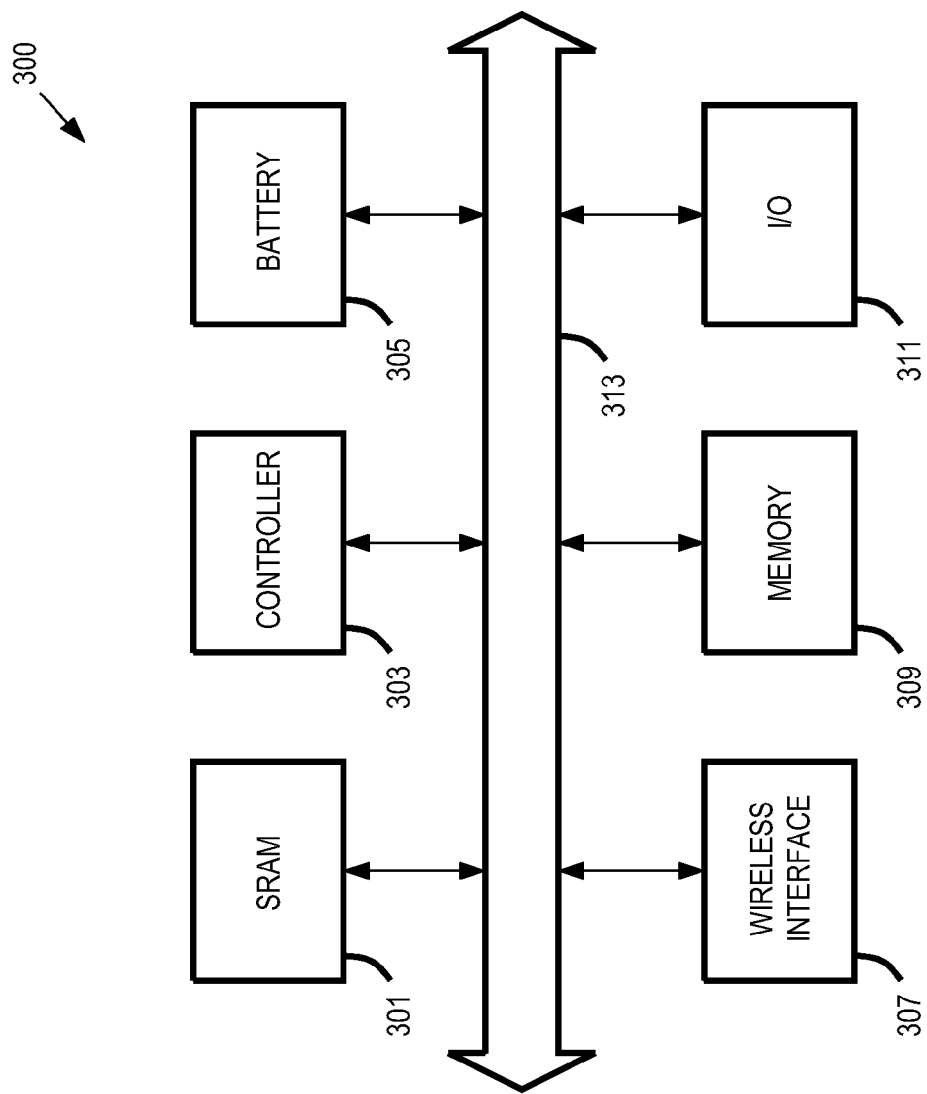
FIG. 3 shows a block diagram of a system embodiment, including a memory device.

With reference now to FIG. 3, a block diagram of an illustrative embodiment of an apparatus in the form of a system 300 including one or more memory devices (e.g., the memory device 101 of FIG. 1) is shown. The system 300 may be used in devices such as, for example, a personal digital assistant (PDA), a laptop or portable computer with or without wireless capability, a web tablet, a wireless telephone, a pager, an instant messaging device, a digital music player, a digital camera, or other devices that may be adapted to transmit or receive information either wirelessly or over a wired connection. The system 300 may be used in any of the following systems: a wireless local area network (WLAN) system, a wireless personal area network (WPAN) system, or a cellular network.

The system 300 of FIG. 3 is shown to include a static random access memory (SRAM) device 301, a controller 303, a wireless interface 307, a memory device 309, and an input/output (I/O) device 311 (e.g., a keypad or a display), each of which is electrically coupled to each other via a bus 313. A battery 305 may supply power to the system 300 in one embodiment. The memory device 309 may include a NAND memory, a flash memory, a NOR memory, a combination of these, or the like. With the possible exception of the battery 305 and the bus 313, any of the various devices shown in FIG. 3 may benefit from and include circuitry formed by the deck-by-deck processes described herein.

The controller 303 may include, for example, one or more microprocessors, digital signal processors, micro-controllers, or the like. The memory device 309 may be used to store messages transmitted to or by the system 300. The memory device 309 may optionally also be used to store instructions that are executed by the controller 303 during operation of the system 300 and may be used to store user data either generated, collected, or received by the system 300 (such as image data). The instructions may be stored as digital information and the user data, as disclosed herein, may be stored in one section of the memory as digital data and in another section as analog memory. As another example, a given section at one time may be labeled to store digital information and then later may be relabeled and reconfigured to store analog information.

The I/O device 311 may be used to generate a message. The system 300 may use the wireless interface 307 to transmit and receive messages to and from a wireless communication network with a radio frequency (RF) signal. Examples of the wireless interface 307 may include an antenna, or a wireless transceiver, such as a dipole antenna. However, the scope of the inventive subject matter is not limited in this respect. Also, the I/O device 311 may deliver a voltage reflecting what is stored as either a digital signal (if digital information was stored), or as an analog signal (if analog information was stored). While an example in a wireless application is provided above, embodiments of the inventive subject matter disclosed herein may also be used in non-wireless applications as well.

The various illustrations of apparatus (e.g., the memory device 309 and examples of the various fabrication stages illustrated with reference FIGS. 2A through 2T) are intended to provide a general understanding of the structure of various embodiments and are not intended to provide a complete description of all the elements and features of the apparatus that might make use of the structures, features, and materials described herein. Also, although only two decks are discussed and described, the disclosure is not intended to be so limited. Therefore, the acts and operations discussed herein may be applied to forming any number of decks within a single apparatus.

The description provided herein follows includes illustrative apparatuses (e.g., circuitry, devices, structures, and systems) and methods (e.g., fabrication processes, techniques, and technologies) that embody the subject matter. In the following description, for purposes of explanation, numerous specific details are set forth in order to provide an understanding of various embodiments of the subject matter. It will be evident, however, to a person of ordinary skill in the art that various embodiments of the inventive subject matter may be practiced without these specific details. Further, well-known instruction instances, protocols, structures, fabrication technologies, and techniques have not been shown in detail, so as not to obscure the various illustrated embodiments.

As used herein, the term "or" may be construed in an inclusive or exclusive sense. Additionally, although various exemplary embodiments discussed below focus on a three-dimensional (3D) NAND memory device, the embodiments are merely given for clarity in disclosure, and thus, are not limited to NAND memory devices or even to memory devices in general.

In various embodiments, an apparatus is provided that includes a base substrate with at least two decks of devices formed over the substrate. Each of the at least two decks has a similar structure. A tunneling material is formed substantially concurrently in each of the at least two decks of devices.

In some embodiments of the apparatus, a channel material is substantially concurrently formed in the at least two decks of devices.

In various embodiments, a method is provided that includes forming a first deck having a number of first levels of conductor material and a number of first levels of dielectric material over a substrate. Each level of the number of first levels of conductor material is separated from an adjacent level of conductor material by at least one of the number of first levels of dielectric material. A first opening is formed through the number of first levels of conductor material and the number of first levels of dielectric material. A sacrificial material is formed in the first opening with the sacrificial material at least partially filling the first opening. A second deck is formed over the first deck. The second deck has a number of second levels of conductor material and a number of second levels of dielectric material. Each level of the number of second levels of conductor material is separated from an adjacent level of conductor material by at least one of the number of second levels of dielectric material.

In various embodiments, a method is provided that includes forming a first deck having alternating first conductor materials and first dielectric materials, forming a first channel opening through the alternating first materials, recessing the first conductor materials back from sidewalls of the first channel opening, forming a first charge-storage material adjacent the recessed portions of the first conductor materials, at least partially filling the first channel opening with a sacrificial material, and forming a second deck over the first deck, the second deck having alternating second conductor materials and second dielectric materials. A second channel is formed through the alternating second materials. The second conductor materials are recessed back from sidewalls of the second channel opening. A second charge-storage material is formed adjacent recessed portions of the second conductor materials. The sacrificial material is removed, thereby forming a multi-deck channel opening. The first charge-storage material and the second charge-storage material are substantially concurrently formed to be substantially co-planar with sidewalls of the multi-deck channel opening to form a number of charge storage structures in the first and second decks.

In some embodiments of the method, a tunneling material is formed adjacent the charge-storage structures in the first and second decks substantially concurrently.

In various embodiments, a method is provided that includes forming a first channel opening through a first deck of materials, at least partially filling the first channel opening with a sacrificial material, forming a second deck of materials over the first deck, forming a second channel opening through the second deck and substantially vertically aligned with the first channel opening, removing the sacrificial material, thereby forming a multi-deck channel opening, and forming a thermally-grown silicon dioxide tunneling material within the first deck and the second deck substantially concurrently.

In some embodiments of the method, a first charge-store material is formed within the first channel opening and a second charge-store material is formed within the second channel opening.

In various embodiments, an apparatus is provided that includes a first deck formed over a substrate and having a number of first memory cells and a second deck formed over the first deck and having a number of second memory cells. A channel material is formed substantially concurrently in the first and second decks.

In some embodiments of the apparatus, a tunneling material is formed substantially concurrently formed in each of the first and second decks.

The apparatus and methods of the various embodiments may include or be included in, for example, electronic circuitry used in high-speed computers, communication and signal processing circuitry, single or multi-processor modules, single or multiple embedded processors, multi-core processors, data switches, and application-specific modules including multilayer, multi-chip modules, or the like. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

One of ordinary skill in the art will appreciate that, for this and other methods disclosed herein, the activities within the methods may be implemented in a differing order than has been described. Further, the outlined acts and operations are only provided as examples, and some of the acts and operations may be optional, combined into fewer acts and operations, or expanded into additional acts and operations without detracting from the essence of the disclosed embodiments. Also, identifications provided herein and labeled as first, second, third, etc. do not necessarily indicate any type of order or importance and is simply provided for ease in identification throughout the various embodiments.

The present disclosure is therefore not to be limited in terms of the particular embodiments described in this application, which are intended as illustrations of various aspects. For example, instead of floating gate flash memory devices, charge trap memory devices may be used. Many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to comply with 37 C.F.R. § 1.72(b), requiring an abstract allowing the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims.

Thus, the following claims are hereby incorporated into the Detailed Description, with each claim standing on its own as a separate embodiment.

What is claimed is:

1. A method, comprising:
   forming a first deck, comprising,
      forming multiple first levels of conductor material and multiple first levels of dielectric material over a substrate, each level of the multiple first levels of conductor material being separated from an adjacent first level of conductor material by at least one of the multiple first levels of dielectric material;
      forming a first set of openings through the multiple first levels of conductor material and the multiple first levels of dielectric material, the first set of openings defined by respective first sidewalls, the respective first sidewalls defined at least in part by the multiple first levels of conductor material and multiple first levels of dielectric material;
      depositing a charge blocking barrier extending over the respective sidewalls of the first set of openings;
      depositing a charge storage material over the charge blocking barrier over the respective sidewalls of the first set of openings;
      forming respective sacrificial material extending laterally in the first set of openings between the sidewalls of upper first levels of conductor material and upper first levels of dielectric material, and adjacent the charge storage material deposited over the sidewalls, the sacrificial material partially filling the respective openings of the first set of openings and forming caps over air gaps located within respective openings of the first set of openings;
   forming a barrier level over an upper surface of the first deck, the barrier level extending above the sacrificial material;
   forming a second deck over the first deck, comprising,
      forming multiple second levels of conductor material and multiple second levels of dielectric material, each level of the multiple second levels of conductor material being separated from an adjacent second level of conductor material by at least one of the multiple second levels of dielectric material;
      forming a second set of openings through the multiple second levels of conductor material and the multiple second levels of dielectric material, the second set of openings defined by respective second sidewalls, the respective second sidewalls formed at least in part by the multiple second levels of conductor material and multiple second levels of dielectric material, the openings of the second set of openings being substantially vertically aligned with a respective opening of the first set of openings;
      depositing a charge blocking barrier extending over the respective sidewalls of the second set of openings;
      depositing a charge storage material over the charge blocking barrier over the respective second sidewalls of the second set of openings; and
   removing the sacrificial material from the first set of openings, forming first multi-deck openings through the first deck and the second deck.

2. The method of claim 1, wherein at least some of the multi-deck openings comprises multi-deck channel openings, and further comprising forming a continuous channel-fill material in the multi-deck channel openings.

3. The method of claim 1, wherein at least some of the multi-deck openings that do not have silicide formed therein comprise multi-deck channel openings; and further comprising forming a tunneling material in the multi-deck channel openings.

4. The method of claim 1, wherein the multi-deck opening comprises a multi-deck gate-slit opening.

5. The method of claim 1, further comprising:
laterally recessing each of the first levels of conductor material back from opposing faces of at least some of the first set of openings.

6. The method of claim 5, further comprising:
forming a charge blocking material adjacent laterally recessed portions of the multiple first levels of conductor material; and
forming a charge-storage material adjacent the charge blocking material.

7. A method, comprising:
forming a first deck having alternating first conductor materials and first dielectric materials such that each level of the first conductor material is separated from another level of the first conductor material by a level of the first dielectric material;
forming a first channel opening through the alternating first conductor materials and first dielectric materials, the first channel opening defined by first sidewalls;
forming a first gate-slit opening through the alternating first conductor materials and first dielectric materials, the first gate slit opening defined by second sidewalls;
recessing the first conductor materials back from sidewalls of the first channel opening;
forming a first charge-storage material between the recessed portions of the first conductor materials and the first channel opening;
at least partially filling the first channel opening and the first gate-slit opening with a sacrificial material,
the sacrificial material extending laterally within the first gate-slit opening between an upper portion of the second sidewalls formed by upper first levels of conductor materials and upper first levels of dielectric materials to partially fill the first gate-slit opening and to form a cap over an air gap located within the second sidewalls of the first gate-slit opening and above a substrate upon which the first deck of materials is formed;
the sacrificial material also extending laterally within the first channel opening between an upper portion of the first sidewalls formed by upper first dielectric materials and upper first conductor materials and the charge storage material formed over the upper first conductor material materials, to partially fill the first channel opening and to form a cap over an air gap located within the first sidewalls of the first channel opening;
forming a second deck over the first deck, the second deck having alternating second conductor materials and second dielectric materials such that each level of the second conductor material is separated from another level of the second conductor material by a level of the second dielectric material;
forming a second channel opening through the alternating second conductor materials and second dielectric materials;
forming a second gate-slit opening through the alternating second conductor materials and second dielectric materials;
recessing the second conductor materials back from sidewalls of the second channel opening;

forming a second charge-storage material between the recessed portions of the second conductor materials and the second channel opening;
removing the sacrificial material from the first channel opening and the first gate-slit opening, thereby forming a multi-deck channel opening and a multi-deck gate-slit opening, respectively;
substantially concurrently removing a portion of the first charge-storage material and the second charge-storage material so as to be substantially co-planar with sidewalls of the multi-deck channel opening to form a number of discrete charge storage structures in the first and second decks; and
forming silicide substantially concurrently on exposed areas of the first conductor materials and the second conductor materials within the multi-deck gate-slit opening.

8. The method of claim 7, further comprising forming a tunneling material adjacent the charge-storage structures in the first and second decks substantially concurrently.

9. The method of claim 7, further comprising forming a continuous channel-fill material in the multi-deck channel opening.

10. The method of claim 7, wherein the first channel opening and the first gate-slit opening are each substantially vertically aligned with the second channel opening and the second gate-slit opening, respectively.

11. The method of claim 7, further comprising:
forming a source side select gate (SGS) structure on a first side of the first deck; and
forming a drain side select (SDS) structure on a side of the second deck that is distal to the first deck.

12. A method, comprising:
forming a first channel opening through a first deck of materials, the first deck of materials including alternating first conductive levels and first dielectric levels, the first channel opening defined by first sidewalls;
forming a first gate-slit opening through the first deck of materials, wherein the gate slit opening laterally separates a first portion of the first conductive levels of the first deck from a second portion of the first conductive levels of the first deck, the first gate-slit opening defined by second sidewalls of the first conductive levels and the first dielectric levels;
at least partially filling each of the first channel opening and the first gate-slit opening with a sacrificial material,
the sacrificial material extending laterally between upper first dielectric materials and first conductive materials adjacent the first channel opening to partially fill the first channel opening and to form a cap over an air gap within the first channel opening,
the sacrificial material also extending laterally within the upper portions of the second sidewalls of the first gate-slit opening to partially fill the first gate-slit opening and to form a cap over an air gap within the first gate-slit opening;
forming a second deck of materials over the first deck, the second deck of materials including alternating second conductive levels and second dielectric levels;
forming a second channel opening and a second gate-slit opening through the second deck and substantially vertically aligned with the first channel opening and the first gate-slit opening, respectively, the second channel opening not having a sacrificial material formed therein at any temporal point during formation of either the first deck or the second deck, the second deck comprising memory devices;

removing the sacrificial material from the first deck of materials, thereby forming a multi-deck channel opening and a multi-deck gate-slit opening;

forming a thermally-grown silicon dioxide tunneling material within the first deck and the second deck substantially concurrently; and forming silicide substantially concurrently on exposed areas of conductive materials within the first deck of materials and the second deck of materials within the multi-deck gate-slit opening.

13. The method of claim 12, wherein the multi-deck channel opening is formed by combining the first channel opening through the first deck with the second channel opening through the second deck.

14. The method of claim 12, further comprising:

forming a first charge-storage material within the first channel opening; and forming a second charge-storage material within the second channel opening.

15. The method of claim 14, further comprising substantially concurrently etching the first charge-storage material and the second charge-storage material to be substantially co-planar with sidewalls of the multi-deck channel opening.

16. A method, comprising:

forming a first deck having multiple first levels of conductor material and multiple first levels of dielectric material over a substrate, each level of the multiple first levels of conductor material being separated from a vertically adjacent level of conductor material by at least one of the multiple first levels of dielectric material;

forming a first gate-slit opening through the first deck and at least through the multiple first levels of conductor material, the first gate-slit opening defined by first sidewalls defined by the multiple first levels of conductor material and at least a portion of the multiple first levels of dielectric material;

forming a sacrificial material fully within the first gate-slit opening, the sacrificial material extending laterally between upper first levels of conductor material and an upper first levels of dielectric material, partially filling the first gate-slit opening to form a cap over an air gap located within the first gate-slit opening;

forming a second deck over the first deck, the second deck having multiple second levels of conductor material and multiple second levels of dielectric material, each level of the multiple second levels of conductor material being separated from an adjacent level of conductor material by at least one of the multiple second levels of dielectric material;

forming a second gate-slit opening through the multiple second levels of conductor material and the multiple second levels of dielectric material, the second gate-slit opening being substantially vertically aligned with the first gate-slit opening, the second gate-slit opening not having a sacrificial material formed therein at any temporal point during formation of either the first deck or the second deck, the second deck comprising memory devices; and removing the sacrificial material from the first gate-slit opening, and forming a multi-deck opening through the first deck and the second deck.

17. A method, comprising:

forming a first deck having alternating first conductor materials and first dielectric materials, such that each level of the first conductor material is separated from another level of the first conductor material by a level of the first dielectric material;

forming a first channel opening through the alternating first conductor materials and first dielectric materials, the first channel opening defined by sidewalls;

forming a first gate-slit opening through the alternating first conductor materials and first dielectric materials;

recessing the first conductor materials back from sidewalls of the first channel opening;

forming a first charge-storage material adjacent the recessed portions of the first conductor materials;

partially filling the first channel opening and the first gate-slit opening with a sacrificial material, the sacrificial material extending laterally between upper first dielectric materials and upper first conductor materials and the first charge-storage material formed adjacent the first conductor materials to partially fill the first channel opening and to form a cap over an air gap located within the first channel opening sidewalls, the sacrificial material extending adjacent one or more upper first conductor materials and first dielectric materials of the first deck;

forming a second deck over the first deck, the second deck having alternating second conductor materials and second dielectric materials such that each level of the second conductor material is separated from another level of the second conductor material by a level of the second dielectric material;

forming a second channel opening through the alternating second conductor materials and second dielectric materials;

forming a second gate-slit opening through the alternating second conductor materials and second dielectric materials;

recessing the second conductor materials back from sidewalls of the second channel opening;

forming a second charge-storage material adjacent the recessed portions of the second conductor materials;

removing the sacrificial material from the first channel opening and the first gate-slit opening, thereby forming a multi-deck channel opening and a multi-deck gate-slit opening, respectively;

substantially concurrently removing a portion of the first charge-storage material and the second charge-storage material so as to be substantially co-planar with sidewalls of the multi-deck channel opening and to form a number of discrete charge storage structures in the first deck and the second deck;

forming a tunneling material adjacent the first charge-storage structures and the second charge-storage structures in the first deck and the second deck substantially concurrently;

forming the tunneling material into portions, each of the portions being associated with separate ones of the number of discrete charge storage structures in the first deck and the second deck; and forming silicide substantially concurrently on exposed areas of the first conductor materials and the second conductor materials within the multi-deck gate-slit opening.

* * * * *